(12) United States Patent
Coelho, Jr. et al.

(10) Patent No.: US 8,572,527 B1
(45) Date of Patent: Oct. 29, 2013

(54) GENERATING PROPERTIES FOR CIRCUIT DESIGNS

(75) Inventors: Claudionor José Nunes Coelho, Jr., Nova Lima (BR); Fabiano Cruz Peixoto, Belo Horizonte (BR)

(73) Assignee: Jasper Design Automation, Inc., Mountain View, CA (US)

( * ) Notice: Subject to any disclaimer, the term of this patent is extended or adjusted under 35 U.S.C. 154(b) by 33 days.

(21) Appl. No.: 13/231,583

(22) Filed: Sep. 13, 2011

(51) Int. Cl.
*G06F 17/50* (2006.01)

(52) U.S. Cl.
USPC .......................................... 716/102; 716/111

(58) Field of Classification Search
USPC .................................... 716/102, 111
See application file for complete search history.

(56) References Cited

U.S. PATENT DOCUMENTS

| | | |
|---|---|---|
| 6,618,841 B1 | 9/2003 | Huang |
| 7,243,322 B1 | 7/2007 | Ly et al. |
| 7,325,209 B2 | 1/2008 | Mitra et al. |
| 7,421,668 B1 | 9/2008 | Ip et al. |
| 7,725,851 B2 | 5/2010 | Eisner et al. |
| 7,908,532 B2 | 3/2011 | Eckelman et al. |
| 7,926,020 B1 | 4/2011 | Lu et al. |
| 7,958,475 B2 | 6/2011 | Khan |
| 7,984,401 B2 | 7/2011 | Lehavot et al. |
| 8,024,691 B2 | 9/2011 | Zilic et al. |
| 8,326,778 B1 | 12/2012 | Lu et al. |
| 2001/0016933 A1 | 8/2001 | Chang et al. |
| 2002/0138812 A1* | 9/2002 | Johannsen ........................ 716/5 |
| 2004/0236560 A1 | 11/2004 | Chen |
| 2005/0198611 A1 | 9/2005 | Ebert et al. |
| 2005/0209840 A1 | 9/2005 | Baklashov et al. |
| 2006/0066339 A1 | 3/2006 | Rajski et al. |
| 2006/0156145 A1 | 7/2006 | Mitra et al. |
| 2007/0294651 A1* | 12/2007 | Tsai et al. .......................... 716/5 |
| 2007/0299648 A1 | 12/2007 | Levitt et al. |
| 2008/0082946 A1 | 4/2008 | Zilic et al. |
| 2008/0184180 A1* | 7/2008 | Takenaka et al. ................. 716/6 |
| 2009/0204931 A1 | 8/2009 | Lim et al. |
| 2010/0088257 A1 | 4/2010 | Lu et al. |

OTHER PUBLICATIONS

NextOp Software, Inc., "Assertion Synthesis," May 16, 2010, three pages. [Online] [Retrieved Nov. 1, 2011] Retrieved from the Internet <URL:http://web.archive.org/web/20100516025551/http://www.nextopsoftware.com/BugScope-assertion-synthesis.html.>.
U.S. Appl. No. 13/347,114, filed Jan. 10, 2012, Inventor Asa Ben-Tzur.
U.S. Appl. No. 13/455,926, filed Apr. 25, 2012, Inventors Asa Ben-Tzur et al.

* cited by examiner

*Primary Examiner* — Vuthe Siek
*Assistant Examiner* — Mohammed Alam
(74) *Attorney, Agent, or Firm* — Fenwick & West LLP

(57) ABSTRACT

An analysis tool that generates properties for a circuit design. The debugging tool receives a circuit design encoded in a hardware description language. The tool identifies portions of the circuit design that correspond to features of interest (e.g., counters, finite state machines, one hot vectors, etc) in the circuit design. Each portion of the circuit design has a cone of influence, and the tool identifies control signals from within the cones of influence. By identifying control signals in this manner, the tool can then generate the properties based on values for the control signals and the identified portions of the circuit design that are obtained from data describing the operation of the circuit design over a number of clock cycles (e.g., simulation data). The result is one or more properties that are likely to represent a relevant behavior of the circuit design.

28 Claims, 9 Drawing Sheets

| pop | push | wptr | rptr | next(wptr) | next(rptr) |
|---|---|---|---|---|---|
| 1 | 1 | 0000 | 0000 | 0001 | 0001 |
| 1 | 0 | 0001 | 0001 | 0010 | 0001 |
| 1 | 1 | 0010 | 0001 | 0011 | 0010 |
| 0 | 1 | 0011 | 0010 | 0011 | 0011 |
| 1 | 0 | 0011 | 0011 | 0100 | 0011 |
| 1 | 0 | 0100 | 0011 | 0101 | 0011 |
| 1 | 0 | 0101 | 0011 | 0110 | 0011 |
| 1 | 1 | 0110 | 0011 | 0111 | 0100 |
| 0 | 1 | 0111 | 0100 | 0111 | 0101 |
| 0 | 0 | 0111 | 0101 | 0111 | 0101 |
| 0 | 1 | 0111 | 0101 | 0111 | 0110 |
| 0 | 1 | 0111 | 0110 | 0111 | 0111 |
| 1 | 1 | 0111 | 0111 | 1000 | 1000 |
| 1 | 0 | 1000 | 1000 | 1001 | 1000 |
| 0 | 0 | 1001 | 1000 | 1001 | 1000 |
| 0 | 1 | 1001 | 1000 | 1001 | 1001 |
| 0 | 1 | 1001 | 1001 | 1001 | 1010 |
| 1 | 1 | 1001 | 1010 | 1010 | 1011 |
| 1 | 1 | 1010 | 1011 | 1011 | 1100 |
| 0 | 0 | 1011 | 1100 | 1011 | 1100 |
| 1 | 1 | 1011 | 1100 | 1100 | 1101 |
| 1 | 0 | 1100 | 1101 | 1101 | 1101 |
| 0 | 0 | 1101 | 1101 | 1101 | 1101 |
| 0 | 0 | 1101 | 1101 | 1101 | 1101 |
| 1 | 0 | 1101 | 1101 | 1110 | 1101 |
| 0 | 1 | 1110 | 1101 | 1110 | 1110 |
| 1 | 0 | 1110 | 1110 | 1111 | 1110 |
| 0 | 0 | 1111 | 1110 | 1111 | 1110 |
| 0 | 0 | 1111 | 1110 | 1111 | 1110 |
| 1 | 1 | 1111 | 1110 | 0000 | 1111 |
| 1 | 1 | 0000 | 1111 | 0001 | 0000 |
| 1 | 0 | 0001 | 0000 | 0010 | 0000 |
| 0 | 1 | 0010 | 0000 | 0010 | 0001 |
| 1 | 1 | 0010 | 0001 | 0011 | 0010 |
| 0 | 0 | 0011 | 0010 | 0011 | 0010 |
| 1 | 1 | 0011 | 0010 | 0100 | 0011 |
| 0 | 1 | 0100 | 0011 | 0100 | 0100 |
| 1 | 0 | 0100 | 0100 | 0101 | 0100 |
| 1 | 1 | 0101 | 0100 | 0110 | 0101 |
| 1 | 0 | 0110 | 0101 | 0111 | 0101 |
| 1 | 1 | 0111 | 0101 | 1000 | 0110 |
| 0 | 0 | 1000 | 0110 | 1000 | 0110 |
| 0 | 0 | 1000 | 0110 | 1000 | 0110 |
| 1 | 1 | 1000 | 0110 | 1001 | 0111 |
| 0 | 0 | 1001 | 0111 | 1001 | 0111 |
| 1 | 1 | 1001 | 0111 | 1010 | 1000 |
| 1 | 1 | 1010 | 1000 | 1011 | 1001 |

| | push | pop | encoded(wptr) | encoded(rptr) |
|---|---|---|---|---|
| 512 | 1 | 1 | 100000 | 100000 |
| 514 | 1 | 0 | 100000 | 000010 |
| 516 | 1 | 1 | 100000 | 100000 |
| 518 | 0 | 1 | 000010 | 100000 |
| | ... | ... | ... | ... |
| 519 | 1 | 1 | 100000 | 001000 |
| | ... | ... | ... | ... |

| | push | pop | encoded(wptr) | encoded(rptr) |
|---|---|---|---|---|
| | 0 | 0 | 000010 | 000010 |
| 522 | 1 | 0 | 100000 | 000010 |
| | 1 | 1 | 001000 | 100000 |
| | 0 | 1 | 000010 | 100000 |
| 524 | 1 | 1 | 100000 | 101000 |

FIG. 5B

| | push | pop | encoded(wptr) | encoded(rptr) |
|---|---|---|---|---|
| 532 | - | - | 010101 | - |
| 534 | 1 | - | 000010 | - |
| | 0 | - | 101000 | - |
| | - | 0 | 001000 | - |
| | - | - | - | 010101 |
| | - | 1 | 101010 | 000010 |
| | - | - | 001000 | 000010 |
| | - | 0 | 100000 | 101000 |
| | - | - | 001010 | 001000 |
| | - | 0 | 101010 | 100000 |

FIG. 5C

| | push | pop | encoded(wptr) | encoded(rptr) |
|---|---|---|---|---|
| 542 | - | - | 000010 | 001000 |
| 544 | - | - | 001000 | 001010 |
| | - | 1 | - | 010111 |
| | 1 | - | 010111 | - |
| | - | 0 | - | 111101 |
| | 0 | - | 111101 | - |

FIG. 5D

GENERATING PROPERTIES FOR CIRCUIT DESIGNS

BACKGROUND

This invention relates generally to analysis of circuit designs, and more particularly to generating properties for circuit designs.

As the complexity in circuit design has increased, there has been a corresponding improvement in various kinds of verification and debugging techniques. In fact, these verification and debugging techniques have evolved from relatively simple transistor circuit-level simulation (in the early 1970s) to logic gate-level simulation (in the late 1980s) to the current art that uses Register Transfer Language (RTL)-level simulation, and formal verification. RTL describes the registers of a computer or digital electronic system and the way in which data are transferred among the combinational logic between registers.

During some of these verification techniques, a circuit design may be tested against a set of properties to evaluate the operation of the circuit design. Properties are logical statements that describe some aspect of the circuit design. The conventional method for creating properties requires the circuit designer to examine the circuit design and to manually code the properties based on the circuit designer's own knowledge of the circuit design. However, manually creating properties is tedious and prone to errors. Furthermore, as the circuit design changes, the properties must be checked for consistency and re-written to comply with the design changes. Accordingly, what are needed are techniques to expedite the process of generating properties and to reduce the overall time needed for verifying a circuit design.

SUMMARY

An analysis tool automatically generates properties for a circuit design from simulation data for the circuit design. In one embodiment, the debugging tool receives a circuit design encoded in a hardware description language. The tool identifies portions of the circuit design that correspond to features of interest (e.g., counters, finite state machines, one hot vectors, etc) in the circuit design. Each portion of the circuit design has a cone of influence, and the tool identifies control signals from within the cones of influence. By identifying control signals in this manner, the tool can then generate the properties based on values of the control signals and the identified portions of the circuit design that are obtained from data describing the operation of the circuit design over a plurality of clock cycles (e.g., simulation data). The result is one or more properties that are likely to represent a relevant behavior of the circuit design.

In some embodiments, the properties are generated from logic in the circuit design that compares one portion of the circuit design with another portion of the circuit design. The logic can be identified, for example, from relational expressions (e.g., "register_a==register_b") found in the description of the circuit design itself. The description of the circuit design is often written by a circuit designer that uses certain expressions to define the behavior of the circuit design. By leveraging the circuit designer's own expression of circuit design behavior, the properties generated by the analysis tool are thus easier for the circuit designer to comprehend.

In some embodiments, the analysis tool generates a set of behaviors from the data describing the operation of the circuit design and generalizes the behavior into a reduced set of properties, which allows a large set of behaviors to be represented with a limited number of properties. The analysis tool may also generate properties that represent behavior that was not observed in the data describing the operation of the circuit design, which can be indicative of coverage gaps that represent either design failures or failures in the testbenches.

The output of the analysis tool may be used in a variety of applications. For example, the properties generated by the analysis tool may be passed on to a formal verification or simulation tool that performs additional tests on the circuit design. The properties may be compiled into a report that is presented to a circuit designer who then makes additional changes to the properties. The properties may also be stored to disk for later use by the circuit designer in testing the circuit design.

BRIEF DESCRIPTION OF THE DRAWINGS

FIG. 4 is simulation data for the circuit design of FIG. 3, in accordance with an embodiment of the invention.

FIG. 5A is a set of behaviors generated from a translation of five lines of the simulation data in FIG. 4, in accordance with an embodiment of the invention.

FIG. 5B is a set of reduced behaviors generated from the behaviors in FIG. 5A, in accordance with an embodiment of the invention.

FIG. 5C is a set of behaviors that were not observed in the simulation data, in accordance with an embodiment of the invention.

FIG. 5D is a reduced set of behaviors that were not observed in the simulation data, in accordance with an embodiment of the invention.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Tool Flow and Methodology for Property Generation

Figure 1:
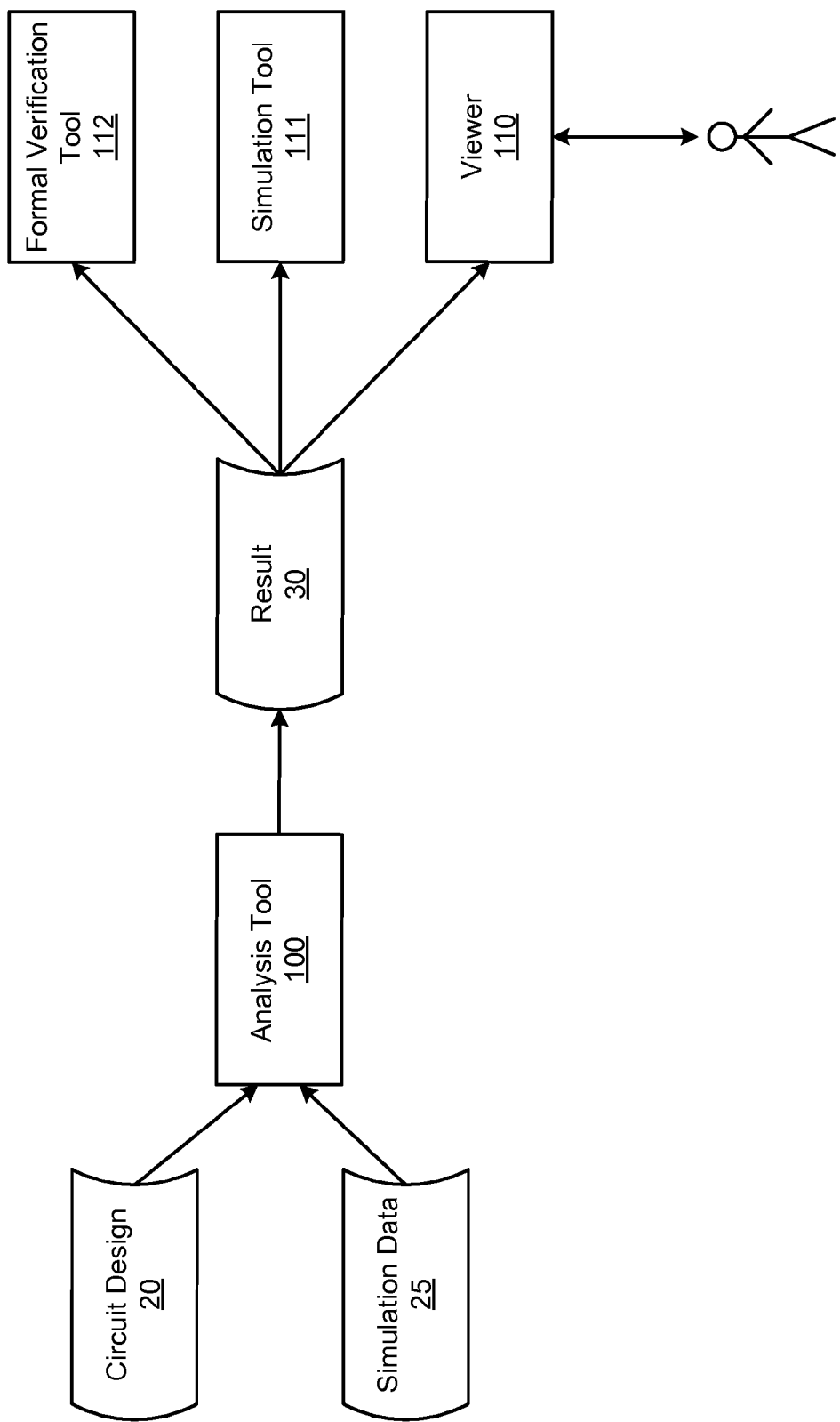
FIG. 1 is a diagram of property generation in accordance with an embodiment of the invention.

FIG. 1 illustrates a diagram of property generation for a circuit design 20, according to an embodiment. The description of the circuit design 20 describes the structural design and operation of a circuit. The description of the circuit design 20 may be embodied as register transfer level (RTL) source code encoded using a hardware description language (HDL) such as Verilog HDL or VHDL. In other embodiments, the description of the circuit design 20 may be embodied as a gate level netlist. The simulation data 25 may be comprised of one or more simulation traces that specify values of registers and signals in the circuit design 20 and thus describes the operation of the circuit design over a number of clock cycles. The simulation data 25 may be stored to disk and retrieved by the analysis tool 100 or passed along from a tool that performed the simulation.

An analysis tool 100 receives the circuit design 20 and simulation data 25 and generates a result 30. The result 30 includes one or more properties that are obtained by analyzing the circuit design 20 in conjunction with the simulation data 25. The properties may include assertions, where the assertion is satisfied if the property is true for all operating conditions of the circuit design 20. An example of an assertion is "if A is 1, B must be 1 in the next clock cycle." The properties may include covers, where the cover is satisfied if the property is true for some operating condition of the circuit design 20. An example of an cover is "if A is 1, B could be 1 in the next clock cycle," if it is observed that B sometimes but not always occurs after A. The properties may also include coverage holes, which are conditions that were never observed in the simulation data 25. An example of a coverage hole is "A and B were never asserted at the same time."

In one embodiment, the result 30 of the formal verification process may be formatted into a report and presented in a viewer 110 to a circuit designer to facilitate the designer's understanding of the circuit design 20.

In another embodiment, the result 30 may be passed along to a simulation tool 111 that re-simulates the circuit design 20 over a number of additional clock cycles. The simulation tool 111 may attempt to close any coverage holes by generating additional simulation data that hits the coverage hole. This additional simulation data can also be processed by the property generation tool 100 to refine the results 30 of the property generation tool 30.

In yet another embodiment, the result 30 may be passed along to a formal verification tool 112. The formal verification tool 112 uses mathematical techniques to prove that assertion properties are either always true or provide an example condition (called a counterexample) that demonstrates the property is false. Tools that use formal methods to verify RTL source code and design properties are known as "model checkers." Formal verification tools 112 are typically more exhaustive than simulation based testing and can exercise states of the circuit design that are missed by simulation.

Analysis Tool

Figure 2A:
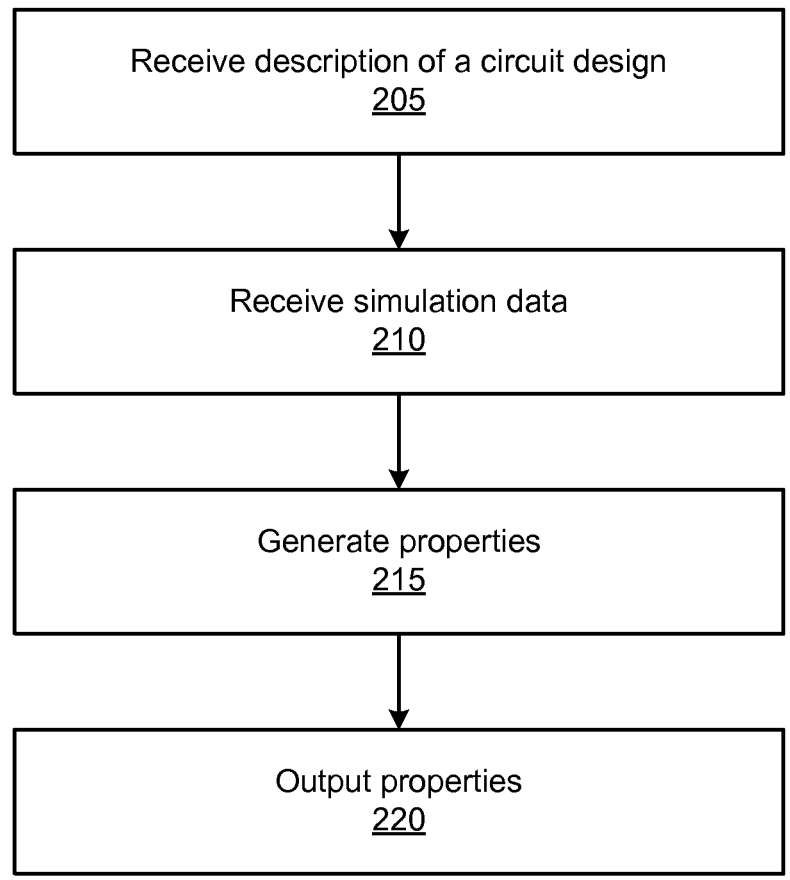
FIG. 2A is a flow chart of an operation of an analysis tool, in accordance with an embodiment of the invention.

Embodiments of the invention provide for an analysis tool that generates properties from a description of a circuit design and simulation data. An example operation of the analysis tool is shown in FIG. 2A. In step 205, the analysis tool 100 receives a description of a circuit design. In step 210, the analysis tool receives data describing the operation of the circuit design over a number of clock cycles, for example, simulation data or data obtained through other means. In step 215, the analysis tool generates one or more properties by analyzing the circuit design and the simulation data for the circuit design. In step 220, the analysis tool outputs the properties, which may be stored to disk, presented to the user, or passed along to a verification tool (e.g., simulation tool or formal verification tool).

Figure 2B:
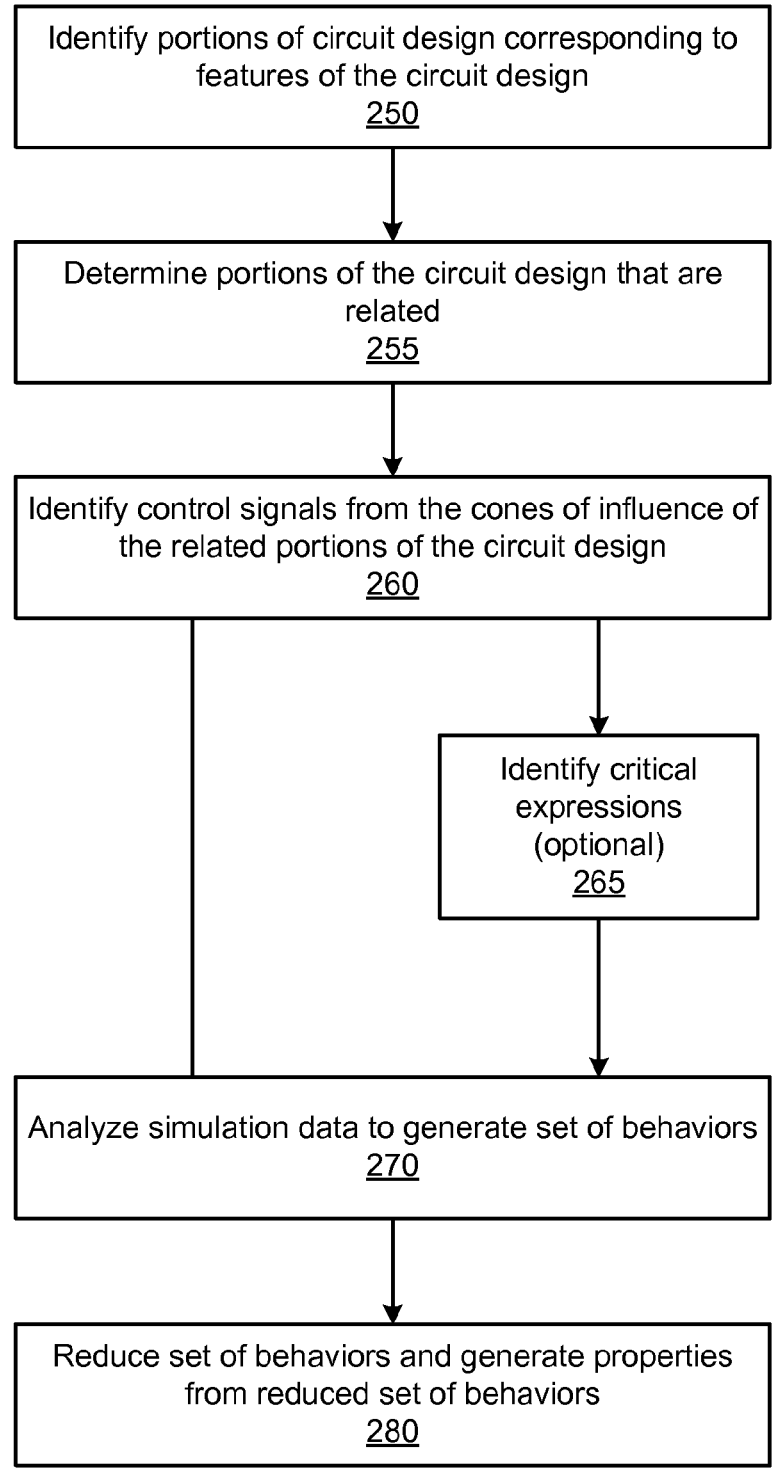
FIG. 2B is a flow chart of an operation of an analysis tool, in accordance with an embodiment of the invention.

Step 215 itself includes a number of substeps, which are illustrated in FIG. 2B. The steps of FIG. 2B are briefly outlined in the next few paragraphs. The steps of FIG. 2B will be explained in greater detail by reference to specific examples in FIGS. 3, 4, 5A-D, 6A-6C, and 7A-7B.

In step 250, the analysis tool identifies portions of the circuit design that correspond to features of interest (e.g., counters, finite state machines, one hot vectors, etc). Portions of the circuit design that correspond to interesting features in the circuit design are referred to herein as points of interest (POI). In one embodiment, if the circuit design is encoded in a hardware description language, the analysis tool may convert the circuit design into a different representation of the circuit design (e.g., a netlist) and then apply one or more heuristics to the circuit design to identify the POIs.

In step 255, the analysis tool determines which of the identified POIs are related to each other and thus should be analyzed together. In one embodiment, related portions of the circuit design are identified by applying one or more heuristics designed to identify relationships between different portions of the circuit design.

In step 260, the analysis tool identifies one or more signals of the circuit design that are control signals in the cones of influence of the related POIs. Each POI of the circuit design has a cone of influence (COI), which refers to parts of the circuit design that can affect that POI. Parts of the circuit design outside of the COI do not affect the operation of the POI. Control signals in the COI are a subset of signals in the COI that control, either directly or indirectly, the routing of other signals within the COI.

In step 265, the analysis tool identifies one or more critical expressions in the description of the circuit design. Critical expressions represent logic in the circuit design that compares a POI to another POI, and are akin to expressions of intended design behavior extracted from the description of the circuit design itself. For example, critical expressions may be relational expressions that compare a POI of the circuit design to other POIs of the circuit design using a combinational function (e.g., "register_a+1!=register_b+3"). In some embodiments the analysis tool may proceed directly from step 260 to step 270 without performing step 265.

In one embodiment, the analysis tool performs one or more of steps 250, 255, 260, or 265 by statically analyzing the circuit design description or another representation of the circuit design that is derived from the circuit design description. Static analysis refers to analyzing the circuit design independently from the simulation data. This enables the analysis tool to determine, in advance of actually using the simulation data, which parts of the simulation data to focus on when generating properties.

In step 270, the analysis tool analyzes the simulation data to generate a set of behaviors corresponding to relationships in the simulation data between the control signals and the POIs. The behaviors are generated from the simulation values of the identified POIs and the simulation values of the control signals in the COIs. In one embodiment, the analysis tool generates a set of behaviors by analyzing pairs of clock cycles in the simulation data. Changes in the POIs from one clock cycle to the next clock cycle are translated into one or more pre-determined categories. When critical expressions are used, the analysis tool evaluates the critical expressions at each clock cycle in generating the set of behaviors. In either situation, the result of the analysis is a set of behaviors that are indicative of relationships between the control signals and POIs. In some embodiments, the analysis tool may also generate a set of behaviors that represent unobserved behaviors in the simulation results by generating the logical complement of the set of behaviors representing observed behaviors.

In step 280, the analysis tool reduces the set of behaviors through logic optimization to create an optimized set of behaviors that more succinctly summarizes the set of behaviors generated in step 270. From this optimized set of behaviors, the analysis tool generates one or more properties. For each property, the analysis tool may also determine whether the property is an assertion, cover, or coverage hole.

Circuit Design Example

Figure 3:
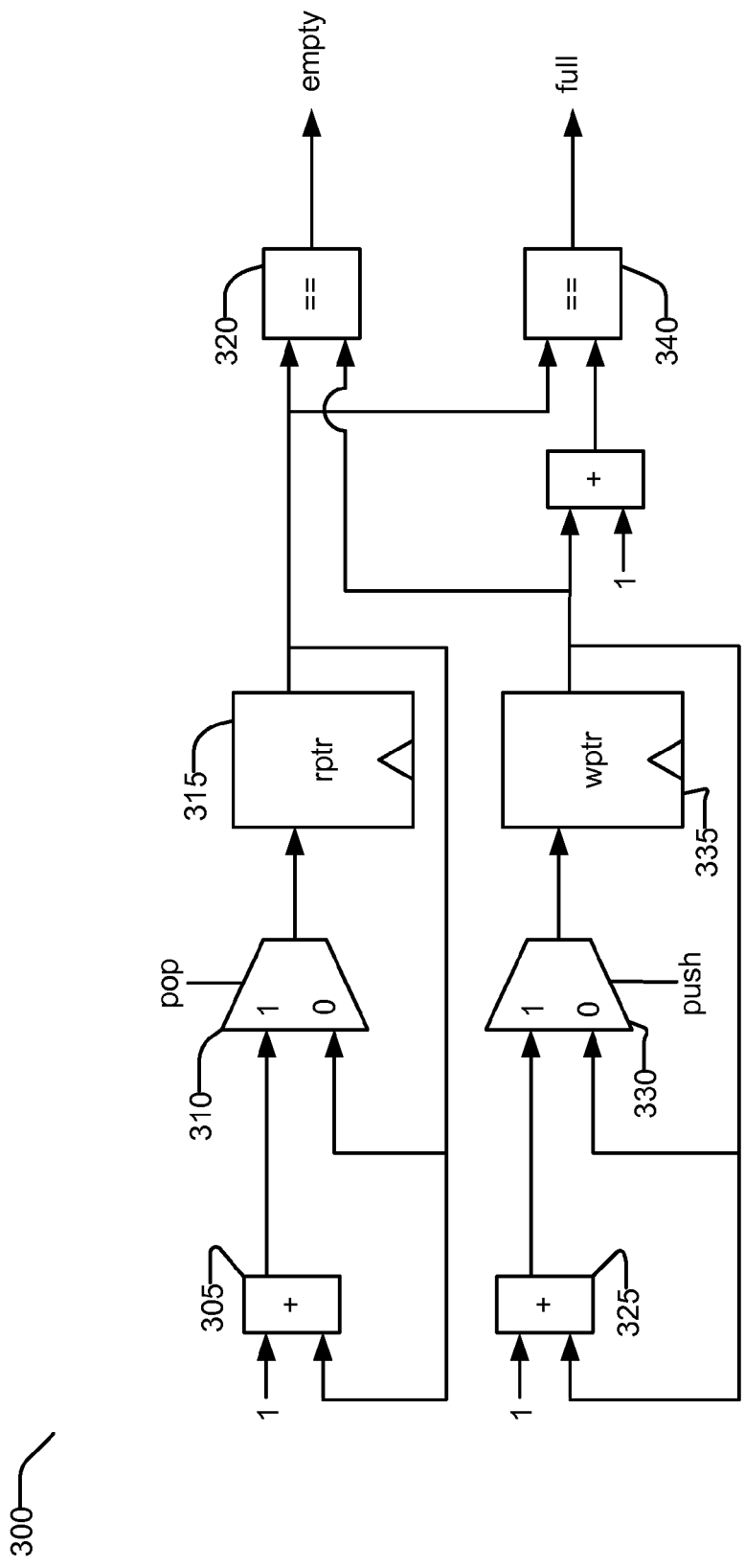
FIG. 3 is a schematic diagram of a portion of a circuit design that controls the read and write pointers of a first-in first-out (FIFO) circuit, in accordance with an embodiment of the invention.

For ease of explanation, the operation of the analysis tool will be described by using the circuit of FIG. 3 as an example. FIG. 3 is a schematic diagram of a portion 300 of a circuit design that controls the read and write pointers of a first-in first-out (FIFO) circuit. In other embodiments, the principles described herein may be applied to other types of circuit designs in order to generate properties for those circuit designs.

The circuit 300 includes two counter circuits. One counter includes an adder 305, multiplexer 310, and read pointer (rptr) register 315. The value of the rptr register 315 is incremented when the pop signal is asserted. Another counter includes an adder 325, multiplexer 330 and write pointer (wptr) register 335. The value of the wptr register 335 is incremented when the push signal is asserted. The values of rptr 315 and wptr 335 are compared 320 to generate the empty signal that indicates whether the FIFO is empty. The value of wptr 335 is incremented by one and compared 340 to the value of rptr 315 to generate the full signal that indicates whether the FIFO is full.

Although drawn as a single line, some of the signals in this circuit 300 may have a bit width that is greater than one. For example, if the rptr register is a four bit register storing values between 0 and 15, the output of the rptr register 315 would be a four bit signal.

In RTL, the source code that implements this circuit 300 may read:

01 input clk;
02 input push, pop;
03 output empty, full;
04
05 reg [3:0] rptr,wptr;
06
07 assign empty=(rptr==wptr);
08 assign full=(wptr+1==rptr);
09
10 always @(posedge clk) if (pop) rptr++;
11 always @(posedge clk) if (push) wptr++;

Simply stated, this code increments rptr at every positive clock if pop is asserted. The code increments wptr at every positive clock is push is asserted. The empty signal is asserted when rptr is equivalent to wptr. The full signal is asserted when rptr is greater than wptr by one.

(i) Identifying Portions of the Circuit Design

In one embodiment, the analysis tool analyzes the circuit design to identify 250 one or more points of interest (POI) in the circuit design that represent features in the circuit design. A POI can be viewed as a portion of the circuit design (e.g., signals or registers) that correspond to some interesting design feature (e.g., counters, finite state machines, one hot vectors, etc). While there is no absolute method of identifying all features in all possible circuit designs, generalities can be made about the design patterns of certain features to enable robust detection algorithms.

For example, to identify a POI that corresponds to a counter, the analysis tool applies a series of heuristics designed to identify counters. The heuristics may search for a register where the data logic of the register uses the output of the register itself. The heuristics may also require that an adder, subtractor, multiplier or divider be in the signaling path between the output of the register and the data input of the register. The heuristics may further require that no other registers exist in the path between the output of the register and the data input of the register.

If these heuristics are applied to the circuit 300 in FIG. 3, wptr 335 and rptr 315 would thus be identified as POIs that represent counters. Specifically, rptr 315 is a register where the output of the register 315 drives the input data logic (adder 305 and mux 310) of the register 315. The signaling path between the input and output of rptr 315 includes an adder 305. The signaling path also includes no additional registers. Thus, rptr 315 meets all the tests defined by the heuristic and is identified as a POI that corresponds to a counter.

Other heuristics are used for identifying POIs that represent other design features. For example, to identify a POI that represents a finite state machine (FSM), the analysis tool applies a series of heuristics designed to identify a FSM. The heuristics may search for a register where the control logic of the register uses the output of the register itself. The heuristics may also require that the output of the register be compared to a constant. As another example, to identify a POI that represents a one-hot bit vector, the analysis tool applies a series of heuristics designed to identify a one-hot bit vector. A one-hot bit vector is a group of signals where only one signal can be asserted at any given time. The heuristics may search for a set of single bit signals where each and every signal is in the control logic of all the other signals. The heuristics may also search for a set of single bit signals where each and every signal shares identical signals in their control logic and identical signals in their data logic, with disjoint value assignments in each path in the RTL. The heuristics may also search for a set of multi-bit signals that are always assigned one-hot patterns under certain conditions.

The analysis tool may be configured to identify any of a number of features that are associated with some pre-determined heuristics. In one embodiment, other techniques can be used to identify the POIs. The algorithm can be designed to read comments in the RTL code that indicate the existence of a feature. Additional detection rules or heuristics may be added to avoid false positives, while the criteria may be relaxed and some tests eliminated to avoid false negatives. The analysis tool may also receive a user input that specifically identifies portions of the circuit design as being POIs.

(ii) Determining Related Portions of the Circuit Design

In one embodiment, the analysis tool also determines 255 whether any of the POIs are related to each other. Related POI are associated with each other and analyzed together when generating properties from the simulation data. Any of a number of heuristics may be applied to determine if the POI are related.

One heuristic determines if two POIs fanout to the same combinatorial logic, i.e. the outputs of two POI are compared with some combinatorial logic. If so, the POIs are related. In one embodiment, this can be determined by analyzing the RTL code for any relational expressions that compare a function of one POI to a function of a different POI (e.g., f(POI1)== g(POI2)). A relational expression compares a portion of the circuit design to another portion of the circuit design using a relational operator, such as "==", "!=", "<" and ">". For example, line 07 of the example RTL source code includes the relational expression of "rptr==wptr." Because rptr is compared to wptr with the relationship operator of "==", rptr and wptr are identified as related POI. As another example, line 08 of the example RTL source code includes the relational expression of "wptr+1==rptr." This statement would also cause rptr and wptr to be identified as related POI. Thus, if two POIs appear on opposing sides of a relational operator in the RTL code, the two POI are determined to be related.

A second heuristic determines whether a POI is in the control cone of influence of another POI. If so, the two POIs are determined to be related. As previously explained, for a given register of the circuit design, a cone of influence (COI) refers to any portions of the circuit design that can affect the register. Portions of the circuit design outside of the cone of influence do not affect the register. For example, the COI of rptr 315 includes the output of multiplexer 310, pop, the output of adder 305, the input of adder 305, and the output of rptr 315. As another example, the COI of wptr 335 includes the output of multiplexer 330, push, the output of adder 325, the input of adder 325, and the output of wptr 335. The control cone of influence (CCOI) refers to a subset of the COI that are control signals controlling the routing of other signals within the COI. For example, the CCOI of rptr 315 includes the pop signal because it controls the routing of signals through multiplexer 310. The CCOI of wpt r 335 includes the push signal because it controls the routing of signals through multiplexer 330.

A third heuristic is determining the extent to which two different POIs share overlapping CCOIs. If there is significant overlap, the two POIs are determined to be related. For example, the CCOI of a register X may include signals A, B, and C. The CCOI of register Y may include signals A, B, and D. The CCOIs of register X and Y thus overlap by two signals: A and B. The union of the CCOIs of registers X and Y includes four signals: A, B, C and D. In one embodiment, the overlap between the CCOIs (e.g., two signals) is compared to the union of the CCOIs (e.g., four signals). If the ratio between the two numbers is greater than a threshold (e.g., 70%), the POIs are determined to be related. The threshold may be set to any pre-determined value. In another embodiment, if the overlap between the CCOIs of two POIs is greater than the minimum number of signals in either CCOI, and it does not match exactly the number of signals in the CCOI, the two POIs are determined to be related.

(iii) Identifying Control Signals from the Cone of Influence

In one embodiment, the analysis tool identifies 260 one or more control signals from the COI of the related portions of the circuit design. The identified control signals are associated with the related POI and analyzed together with the POI when generating properties from the simulation data. As previously explained, the CCOI for a given POI includes a subset of signals from the COI that are control signals. For example, the pop signal is a control signal that is in the COI of the rptr register. The push signal is a control signal that is in the COI of the wptr register.

Even though the CCOI is only a subset of the COI, the CCOI itself may include a large number of signals. In one embodiment, only signals in the CCOI below a certain size are identified as being valid control signals, while larger signals that exceed a certain size are not considered. For example, the analysis tool may be configured to search for 1 bit signals in the CCOI while ignoring any signals that are 2 bits or larger.

In one embodiment, the analysis tool only identifies control signals that directly control the routing of signals through the COI. For example, pop is in the COI of rptr 315 and directly controls the routing of multiplexer 310. In other embodiments, the CCOI includes signals that indirectly control the routing of signals through the COI. For example, pop itself may be generated with the following line of code:

```
12
13 pop=signal_a||signal_b
14
```

Line 13 of this sample code indicates that pop is generated as the logical OR of signal_a and signal_b. Signal_a and signal_b thus indirectly control the value of register rptr 315 because they do not directly control the routing of the multiplexer 310, but instead generate the pop signal that in turn controls the multiplexer 310.

Indirect control signals can be viewed as signals that are in the fanin of the direct control signals. There may be multiple levels of indirect control signals. For example, signal_a itself may be a function of signal_c and signal_d. In one embodiment, the analysis tool may be configured to expand the scope of signals identified from the CCOI by "stepping back" through one or more control levels in the CCOI and identifying signals from those additional control levels. The scope of the search can be set to some default value of configured by a user of the analysis tool. Alternatively, the analysis tool may step back through the control levels using a heuristic, such as looking for common signals between the two CCOIs of two POIs, or stepping back to a different parallel always block, assignment or instance of the RTL.

(iv) Generating Properties from Simulation Data

To generate properties for the circuit design, the analysis tool analyzes the simulation values of the POIs and the simulation values of the identified control signals from their CCOI and generates properties from these values. In one embodiment, the analysis tool analyzes 270 the simulation data to generate a set of behaviors. The analysis tool then reduces 280 the set of behaviors and generates properties from the reduced set of behaviors. Reducing the set of behaviors can be viewed as an optimization step that generalizes the properties to create a reduced number of properties that are easier to comprehend.

FIG. 4 illustrates a set of simulation data for the circuit design of FIG. 3, according to an embodiment. The simulation data is represented as a table that includes the values of pop, push, wptr, and rptr over a period of 47 clock cycles. The first two columns of the table show the values of the push and pop signals, which are the signals in the CCOI of the wptr and rptr registers. The second two columns of the table show the values of the wptr and rptr registers, which were previously identified as the POI. The last two columns of the table show the values of the wptr and rptr registers in the next clock cycle and reflect how the registers increment in response to the pop and push signals.

For example, the first line in the simulation data indicates that pop and push were asserted in the first clock cycle. Wptr and rptr both have a value of 0000 in the first clock cycle. In the next clock cycle, wptr is incremented by one to 0001 and rptr is also incremented by one to 0001. As another example, the second line in the simulation data indicates that pop was asserted but push was not asserted in the second clock cycle. Wptr and rptr both have a value of 0001 in the second clock cycle. In the next clock cycle, wptr is incremented by one to 0010 and rptr remains at 0001.

The simulation data in FIG. 4 only includes simulation data from one or more simulation runs for a limited number of clock cycles. In other embodiments, the simulation data may include information from a lesser or greater number of simulation runs. As the accuracy of the properties generated by the analysis tool increases with the number of simulation runs, it is typically beneficial to use simulation data representing a larger number of simulation runs.

In one embodiment, for each clock cycle in the simulation data, the debugging tool translates or encodes the values of the POIs (e.g., wptr and rptr) into one or more pre-defined categories. The pre-defined categories characterize the change in the values of the POIs from one clock cycle to the next in a way that is relevant to the circuit designer. Additionally, the categories may be different for each type of feature (e.g., counters, FSM, etc) represented by the POIs.

For example, for POIs that are counters, the categories are (1) incremented counter (2) decremented counter (3) overflowed counter (4) underflowed counter (5) stable counter and (6) none of the above. Incremented counter means that a register was incremented in the next clock cycle. Decremented counter means that a register was decremented in the next clock cycle. Overflowed counter means that a register overflowed in the next clock cycle, for example, by surpassing its maximum value (e.g., 1111→0000). Underflowed counter means that a register underflowed in the next clock cycle, for example, by going under its minimum value (e.g., 0000→1111). Stable counter means that the value of the register did not change in the next clock cycle. None of the above means that none of the first five circumstances was encountered in the next clock cycle.

FIG. 5A illustrates a set of behaviors generated from a translation of five lines of the simulation data in FIG. 4, according to an embodiment. The simulation data in FIG. 5A is translated into the pre-defined categories that are represented with the following bit sequences:

100000—incremented register
    010000—decremented register
    001000—overflowed counter
    000100—underflowed counter
    000010—stable register
    000001—none of the above Thus, the first line 512 of the table 510 indicates that in the first clock cycle, push and pop were both asserted. As a result, in the next clock cycle, wptr and rptr were both incremented. The second line 514 indicates that in the second clock cycle, push was asserted and pop was deasserted. As a result, in the next clock cycle, wptr was incremented and rptr was stable. The third 516 line indicates that in the third clock cycle, push and pop were both asserted. As a result, in the next clock cycle, wptr and rptr were both incremented. The fourth line 518 indicates that in the fourth clock cycle, push was deasserted and pop was asserted. As a result, in the next clock cycle, wptr was stable and rptr was incremented. Line 519 indicates that at some later clock cycle, push and pop were both asserted. As a result, in the next clock cycle, wptr was incremented and rptr overflowed. Although only five clock cycles are shown in the table 510, this translation is performed for each clock cycle in the simulation data.

As mentioned, the categories may differ depending on the type of feature represented by a POI. For example, for FSMs, the pre-defined categories may be an evaluation of whether a POI is equal to a critical value. Critical values are identified from expressions in the RTL code that compare a POI to a constant value. For example, if reg_X is a POI, and an expression in the RTL code reads "reg_X !=100", then 100 is a critical value for reg_X.

FIG. 5B illustrates a set of reduced behaviors generated from the behaviors in FIG. 5A, according to an embodiment. Table 520 can be viewed as a set of behaviors that summarizes the observed behavior of the circuit design in the simulation data with a generic set of behaviors. For example, the second line 522 of the table 520 indicates that when push is asserted and pop is deasserted, wptr incremented and rptr was stable in the next clock cycle. This behavior may have been observed several times in the simulation data, but it is represented as a single entry in the table 520.

In one embodiment, table 520 can be generated by eliminating duplicate entries from the table 510 of FIG. 5A. Boolean logic optimization is then performed on the remaining entries to reduce the number of entries in the table, which generates table 520. In one embodiment, logic optimization is performed with the ESPRESSO algorithm, a well known technique for logic minimization developed by Robert Brayton at the University of California, Berkeley. Briefly stated, when the ESPRESSO algorithm is applied to a function table of desired functionality, a minimized table is generated that represents either the ON-cover or OFF-cover of the function, depending on how the ESPRESSO algorithm is used. If the ESPRESSO algorithm is used to compute the ON-cover of table 510 of FIG. 5A, the result is the table 520 of FIG. 5B. In other embodiments, logic optimization algorithms other than ESPRESSO may used in generating the table 520.

From this table 520, the analysis tool can generate properties that summarize the observed relationships between the CCOI (e.g., push and pop) and the POI (e.g., wptr and rptr). Assertion properties generated from table 520 may take the form:

(p1) ~push && ~pop |=> $stable(wptr) && $stable(rptr)
(p2) push && ~pop |=> inc(wptr) && $stable(rptr)
(p3) ~push && pop |=> $stable(wptr) && inc(rptr)

Property p1 means that when push and pop are both deasserted, wptr and rptr are both stable in the next clock cycle. Property p2 means that when push is asserted and pop is deasserted, wptr is incremented and rptr is stable in the next clock cycle. Property p3 means that when push is deasserted and pop is asserted, wptr is stable and rptr is incremented in the next clock cycle. Properties p1, p2 and p3 are considered assertion properties because their push and pop values only appear in a single line of table 520, which indicates that when these push and pop values are seen in the simulation data, the resulting behavior of rptr and wptr always follows the same predictable pattern.

Cover properties generated from table 520 may take the form:

(p4) push && pop |=> inc(wptr) && (inc(rptr) || overflow (rptr))
(p5) push && pop |=> overflow(wptr) && inc(rptr)

Property p4 means that when push and pop are both asserted, in the next clock cycle wptr is incremented and rptr overflows or increments. Property p5 means that when push and pop are both asserted, in the next clock cycle wptr overflows and rptr increments. The last two properties are cover properties because their push and pop values appear in multiple lines of the table 520, which indicates that when these push and pop values are seen in the simulation data, the resulting behavior of rptr and wptr is not completely predictable, and may result in one of a number of different behaviors.

FIG. 5C is a set of behaviors that were not observed in the simulation data, according to an embodiment. For example, the first line 532 of table 530 indicates that regardless of the value of push and pop, a situation was never observed where wptr decremented, overflowed, or none of the first five categories occurred in the next clock cycle. As another example, the second line 534 of table 530 indicates that when push is asserted, a situation was never observed where wptr was stable in the next clock cycle.

Table 530 is the logical complement of Table 520 and may be generated by applying a boolean logic optimization algorithm to compute the negation of the boolean function represented by Table 510 of FIG. 5A. In one embodiment, the analysis tool uses the ESPRESSO algorithm to compute the OFF-cover of Table 510, which results in the Table 530 of FIG. 5C. Alternatively, the analysis tool may apply the boolean logic optimization algorithm to any other function table that represents the behaviors observed in the simulation data, for example, table 520 of FIG. 5B.

FIG. 5D is a reduced set of behaviors that were not observed in the simulation data, according to an embodiment. In one embodiment, table 540 can be generated by applying boolean logic optimization to table 530 of FIG. 5C, for example, by using the ESPRESSO algorithm to compute the ON-cover of table 530.

As shown, the first line 542 of the table 540 indicates that regardless of the value of push and pop, a situation was not observed where wptr was stable and rptr overflowed in the next clock cycle. The second line 544 of the table 540 indicates that regardless of the value of push and pop, a situation was not observed where wptr overflowed and rptr either overflowed or was stable in the next clock cycle.

From this table 540, the analysis tool can generate coverage hole properties that describe the relationships between the CCOI (e.g., push and pop) and the POI (e.g., wptr and rptr) that were not observed in the simulation data. Properties generated from table 540 may take the form:

(p6) $stable(wptr) && overflow(rptr)
(p7) overflow(wptr) && (overflow(rptr) || $stable(rptr))
(p8) pop ##1 (dec(rptr) || underflow(rptr) || $stable(rptr) || jump(rptr))
(p9) push ##1 (dec(wptr) || underflow(wptr) || $stable(wptr) || jump (wptr))
(p10) ~pop ##1 !($stable(rptr))
(p11) push ##1 !($stable(wptr))

Each of these properties p6-p11 are coverage holes that represent behaviors that were not observed in the simulation data. These behaviors may not have been observed for example because not enough simulation data was collected, not enough simulation has been performed in the design, the design has a design flaw that was uncovered by these properties, or because these behaviors represent behaviors that will never occur.

(v) Generating Properties from Simulation Data Using Critical Expressions

In one embodiment, the debugging tool generates properties by using critical expressions, i.e. expressions of intended design behavior extracted from the description of the circuit design itself. The description of the circuit design is written by circuit designers that use certain expressions when coding the circuit design. By leveraging the circuit designer's own expression of the circuit design's intended behavior, the properties generated by the analysis tool are thus easier for the circuit designer to comprehend.

The critical expressions can be viewed as logic in the circuit design that compares a POI to another POI. In one embodiment, critical expressions are identified 265 from relational expressions in the RTL code that compare one POI to a second POI through a combinatorial function. The critical expression may be specified with a relational expression (e.g., POI1==POI2) that includes a relational operator, such as "==" "!=" "<" ">" for comparing one POI to another POI. For example, line 7 of the example RTL source code includes the relational expression of "rptr==wptr." Because this expression compares the POI of rptr and the POI of wptr with the relational operator "==", "rptr==wptr" is identified as a critical expression. As another example, line 8 of the example RTL source code includes the relational expression of "wptr+1==rptr." This expression is also identified as a critical expression.

Once the critical expressions are identified 265, the analysis tool analyzes 270 the simulation data to generate a set of behaviors using the critical expressions. Specifically, the tool selects one of the critical expressions and determines an outcome of the critical expression for each clock cycle of the simulation data. The analysis tool then reduces 280 the set of behaviors and generates properties from the reduced set of behaviors. The process of generating and then reducing behaviors is similar to the process explained in conjunction with FIGS. 5A-5D.

Figure 6A:
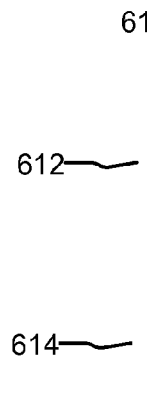
FIG. 6A is a set of behaviors generated by evaluating critical expressions for the simulation data of FIG. 4, in accordance with an embodiment of the invention.

FIG. 6A illustrates a set of behaviors generated by evaluating a critical expression for the simulation data of FIG. 4. Specifically, table 610 represents the evaluation of the critical expression (wptr+1==rptr) over several different clock cycles. The first line 612 of the table 610 indicates that during the first clock cycle, push and pop were both asserted. As a result, in the next clock cycle the critical expression of (wptr+1==rptr) was observed to be false. Line 614 of the table 610 indicates that during one of the clock cycles, push was deasserted and pop was asserted. During the subsequent clock cycle, the critical expression was observed to be true. Critical expressions may be evaluated for each clock cycle of the simulation data, although only five clock cycles are shown in FIG. 6A.

Figure 6B:
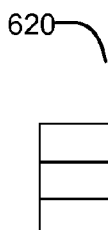
FIG. 6B is a set of reduced behaviors generated from the behaviors in FIG. 6A, in accordance with an embodiment of the invention.

FIG. 6B is a set of reduced behaviors generated from the behaviors in FIG. 6A, according to an embodiment. Table 620 is generated by applying boolean logic optimization to Table 610 of FIG. 6A. From this table 620, the analysis tool can generate properties that describe the observed relationships between the CCOI (e.g., push and pop) and the POIs (e.g., wptr and rptr) by using the critical expressions. An assertion property generated from table 620 may take the form:

(p12) 1 ##1 !(wptr+1==rptr) or (pop || ~push)

Property p12 means that either push is deasserted in the current clock cycle, pop is asserted in the clock cycle, or the critical expression (wptr+1==rptr) evaluates to false the next clock cycle.

Figure 6C:
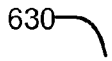
FIG. 6C is a set of behaviors that were not observed in the simulation data, in accordance with an embodiment of the invention.

FIG. 6C is a set of behaviors that were not observed in the simulation data, according to an embodiment. Table 630 is the complement of table 620 and may generated by applying a boolean logic algorithm to negate the table 620 of FIG. 6B. If necessary, table 630 may further be optimized through boolean logic optimization to generate a reduced set of behaviors. The cover property generated from table 630 may take the form:

(p13) push && ~pop ##1 (wptr+1==rptr)

Property P13 means that when push is asserted and pop is deasserted, the critical expression (wptr+1==rptr) evaluates to true in the next clock cycle.

In one embodiment, each critical expression is individually evaluated in the manner illustrated by FIG. 6A-6C in order to generate different sets of properties. For example, FIG. 6A-FIG. 6C only illustrate how the critical expression of (wptr+1==rptr) is used to generate properties for the circuit design. The analysis tool may generate a corresponding set of tables for the other critical expression of (wptr==rptr) and generate a different set of properties from these new tables. Two coverage hole properties generated in this manner for the critical expression of (wptr==rptr) may take the form:

(p14) (wptr==rptr) && overflow(rptr)
(p15) (wptr==rptr) && overflow(wptr)

Figure 7A:
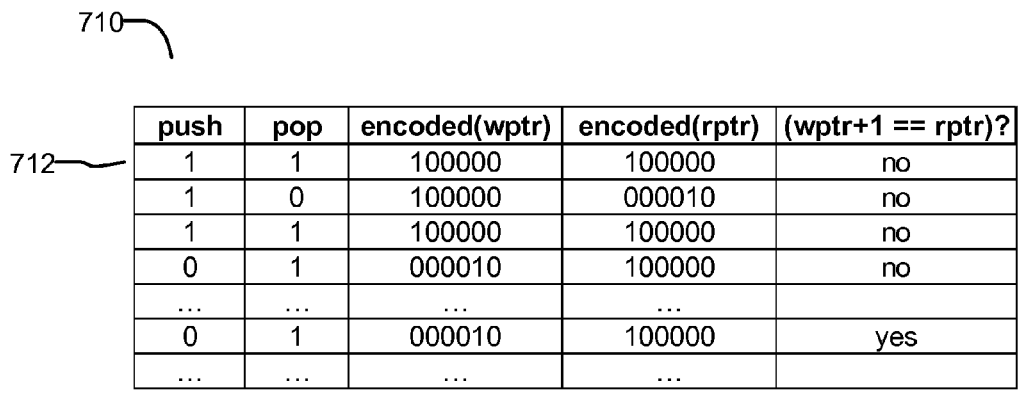
FIG. 7A is a set of behaviors generated by combining the translation of FIG. 5A with critical expressions of FIG. 6A, in accordance with an embodiment of the invention.

In yet another embodiment, the critical expressions may be used in conjunction with category encoding to generate properties. FIG. 7A is a set of behaviors generated by combining the POI translation of FIG. 5A with the evaluation of critical expressions of FIG. 6A. For example, the first line 712 of table 710 indicates that during the first clock cycle, push and pop were both asserted. As a result, wptr and rptr were both incremented in the next clock cycle and the critical expression of (wptr+1==rptr) evaluates to false. Although only five clock cycles are shown in the table 710, this translation and evaluation of critical expressions is performed for each clock cycle in the simulation data.

Figure 7B:
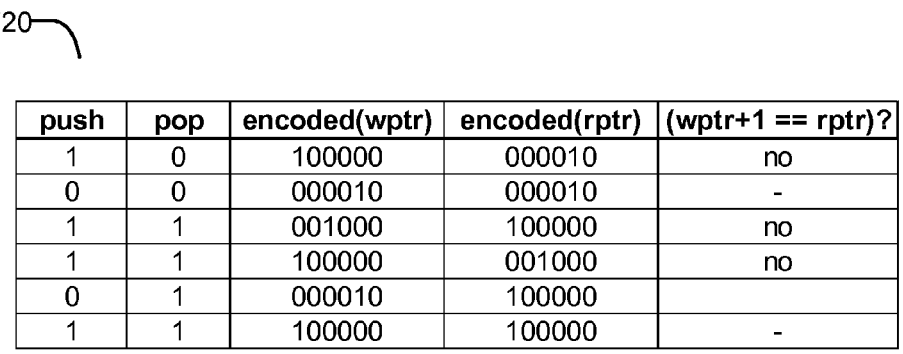
FIG. 7B illustrates a reduced set of behaviors generated from the behaviors in FIG. 7A, in accordance with an embodiment of the invention.

FIG. 7B illustrates a reduced set of behaviors generated from the behaviors in FIG. 7A according to an embodiment. Table 720 is generated by applying boolean logic optimization to Table 710 of FIG. 6A. From this table 720, the analysis tool can generate properties that describe the observed relationships between the CCOI (e.g., push and pop) and the POIs (e.g., wptr and rptr). Cover properties generated from table 720 may take the form:

(p16) push && pop |=>!(wptr+1==rptr) && inc (wptr) && overflow(rptr)

(p17) push && pop |=>!(wptr+1==rptr) && overflow (wptr) && inc(rptr)

Property p16 means that when push and pop are both asserted, in the next clock cycle the critical expression (wptr+1==rptr) evaluates to false, wptr is incremented, and rptr overflows. Property p17 means that when push and pop are both asserted, in the next clock cycle the critical expression (wptr+1==rptr) evaluates to false, wptr is overflows, and rptr increments.

To generate coverage hole properties, the analysis tool may apply a boolean logic optimization algorithm to generate the complement of Table 720. The complement may be reduced into a reduced set of properties with boolean logic optimization. From this reduced set of behaviors, the analysis tool generates one or more properties that represent coverage holes.

The analysis tool disclosed herein this allows for automatic generation of properties for a circuit design from data describing the operation of the circuit design, such as simulation data. By identifying portions of the circuit design and control signals within the COI of those portions of the circuit design, the data can be analyzed to identify properties that are likely to be relevant to the circuit designer. By generating properties using critical expressions specified by the circuit designer, the properties are more likely to be understood by the circuit designer. Additionally, by generalizing the behavior of the circuit design into just a few properties, a fewer number of properties that concisely summarize the behavior of the circuit design can be generated.

Additional Considerations

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/ or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A computer program product for generating circuit design properties, the computer program product comprising a non transitory computer-readable storage medium containing computer program code for:
    receiving a description of a circuit design;
    identifying one or more portions of the circuit design that correspond to features of the circuit design, the identified portions of the circuit design associated with input cones of influence in the circuit design that affect operation of the identified portions of the circuit design;
    identifying one or more control signals from within the input cones of influence associated with the identified portions of the circuit design, the control signals controlling signal routing within the input cones of influence;
    generating one or more properties for the circuit design based on values of the control signals in data describing the operation of the circuit design over a plurality of clock cycles and values of the identified portions of the circuit design in the data describing the operation of the circuit design over the plurality of clock cycles; and
    outputting the properties.

2. A computer program product of claim 1, wherein the description of the circuit design is encoded in a hardware description language.

3. The computer program product of claim 1, wherein the steps of identifying one or more portions of the circuit design and identifying one or more control signals are performed with a static analysis of the circuit design.

4. The computer program product of claim 1, wherein the identified portions of the circuit design comprises registers.

5. The computer program product of claim 1, wherein the identified portions of the circuit design comprise signals.

6. The computer program product of claim 1, wherein identifying the one or more portions of the circuit design comprises:
  identifying a first portion of the circuit design and a second portion of the circuit design;
  determining whether the first and second portions are related; and
  responsive to the first and second portions being related, associating the first portion of the circuit design with the second portion of the circuit design.

7. The computer program product of claim 6, where determining whether the first and second portions are related comprises determining whether the first and second portions are compared with combinatorial logic in the circuit design.

8. The computer program product of claim 6, wherein determining whether the first and second portions are related comprises determining whether the first portion is in a control cone of influence of the second portion.

9. The computer program product of claim 6, wherein determining whether the first and second portions are related comprises determining whether the first and second portions are related based on a number of control signals shared by control cone of influences of the first and second portions.

10. The computer program product of claim 1, wherein identifying the one or more control signals comprises identifying one or more control signals having less than a pre-determined bit size.

11. The computer program product of claim 1, wherein identifying the one or more control signals comprises identifying one or more control signals that directly control the signal routing in the cones of influence.

12. The computer program product of claim 1, wherein identifying the one or more control signals comprises identifying control signals that that indirectly control the signal routing in the cones of influence.

13. The computer program product of claim 1, wherein generating one or more properties comprises:
  identifying logic in the circuit design that compares at least a first portion and a second portion of the identified portions of the circuit design;
  determining an output of the logic based on values of the first and second portions in the data describing the operation of the circuit design; and
  generating one or more properties for the circuit design based on the values of the control signals in the data describing the operation of the circuit design and the output of the identified logic.

14. The computer program product of claim 13, wherein the logic is identified from a relational expression in the description of the circuit design that compares a function of the first portion of the circuit design to a function of the second portion of the circuit design.

15. The computer program product of claim 1, wherein generating the one or more properties comprises:
  generating a set of behaviors for the circuit design based on the values of the control signals and the values of the identified portions of the circuit design in the data describing the operation of the circuit design; and
  generating the one or more properties based on the set of behaviors.

16. The computer program product of claim 15, wherein generating the one or more properties based on the set of behaviors comprises:
  generating a reduced set of behaviors based on the set of behaviors; and
  generating the one or more properties based on the reduced set of behaviors.

17. The computer program product of claim 16, wherein generating the reduced set of behaviors comprises applying a logic optimization algorithm to set the set of behaviors to generate the reduced set of behaviors.

18. The computer program product of claim 15, wherein generating the one or more properties based on the set of behaviors comprises:
  generating a complement set of behaviors based on the set of behaviors, the complement set of behaviors representing a logical complement of the set of behaviors; and
  generating the one or more properties based on the complement set of behaviors.

19. The computer program product of claim 15, wherein generating the set of behaviors comprises translating the values of the identified portions of the circuit design in the data describing the operation of the circuit design into pre-determined categories.

20. The computer program product of claim 1, wherein at least one of the properties represents an assertion.

21. The computer program product of claim 1, wherein at least one of the properties represents a cover.

22. The computer program product of claim 1, wherein at least one of the properties represents a coverage hole.

23. The computer program product of claim 1, wherein outputting the properties comprises storing the properties to a storage device.

24. The computer program product of claim 1, wherein outputting the properties comprises presenting a report of the properties.

25. The computer program product of claim 1, wherein outputting the properties comprises outputting the properties to a simulation tool.

26. The computer program product of claim 1, wherein outputting the properties comprises outputting the properties to a formal verification tool.

27. A computer-implemented method for generating circuit design properties, the method comprising:
  receiving a description of a circuit design;
  identifying one or more portions of the circuit design that correspond to features of the circuit design, the identified portions of the circuit design associated with input cones of influence in the circuit design that affect operation of the identified portions of the circuit design;
  identifying one or more control signals from within the input cones of influence associated with the identified portions of the circuit design, the control signals controlling signal routing within the input cones of influence;
  generating, by a computer, one or more properties for the circuit design based on values of the control signals in data describing the operation of the circuit design over a plurality of clock cycles and values of the identified portions of the circuit design in the data describing the operation of the circuit design over the plurality of clock cycles; and
  outputting the properties.

28. The computer program product of claim 1, wherein the data describing the operation of the circuit design over the plurality of clock cycles is a simulation signal trace for the circuit design.

* * * * *